(12) United States Patent
Burchill et al.

(10) Patent No.: US 10,180,250 B2
(45) Date of Patent: Jan. 15, 2019

(54) USER INTERFACE FOR A HOUSEHOLD APPLIANCE

(71) Applicant: WHIRLPOOL CORPORATION, Benton Harbor, MI (US)

(72) Inventors: Melissa J. Burchill, Benton Harbor, MI (US); Sanghayan Y. Gajbhiye, Hyderabad (IN); Neomar Giacomini, Benton Harbor, MI (US); Robert B. Womack, Chattanooga, TN (US)

(73) Assignee: Whirlpool Corporation, Benton Harbor, MI (US)

( * ) Notice: Subject to any disclaimer, the term of this patent is extended or adjusted under 35 U.S.C. 154(b) by 23 days.

(21) Appl. No.: 15/221,335

(22) Filed: Jul. 27, 2016

(65) Prior Publication Data

US 2018/0031226 A1 Feb. 1, 2018

(51) Int. Cl.

| | |
|---|---|
| *F21V 23/04* | (2006.01) |
| *F21V 19/00* | (2006.01) |
| *G06F 3/0354* | (2013.01) |
| *F21V 33/00* | (2006.01) |
| *G06F 3/041* | (2006.01) |
| *F21W 131/30* | (2006.01) |
| *F21Y 115/10* | (2016.01) |

(52) U.S. Cl.
CPC ...... *F21V 33/0044* (2013.01); *F21V 23/0485* (2013.01); *G06F 3/03547* (2013.01); *G06F 3/041* (2013.01); *F21V 19/004* (2013.01); *F21W 2131/30* (2013.01); *F21Y 2115/10* (2016.08)

(58) Field of Classification Search
CPC ............. F21V 33/0044; F25D 2400/36; F25D 2400/361; G06F 3/041; G06F 3/0412; G06F 3/0416; G06F 3/03547; F24C 3/124; F24C 7/086
See application file for complete search history.

(56) References Cited

U.S. PATENT DOCUMENTS

| | | | | |
|---|---|---|---|---|
| 4,966,004 A | * | 10/1990 | Midlang ............... | F25D 29/005 200/302.2 |
| 6,501,030 B1 | * | 12/2002 | Parizi ................... | H01R 12/585 174/250 |
| 2004/0181985 A1 | * | 9/2004 | Ogden ..................... | G09F 7/04 40/600 |

(Continued)

FOREIGN PATENT DOCUMENTS

| | | |
|---|---|---|
| EP | 1139695 A2 | 10/2001 |
| EP | 1985930 A1 | 10/2008 |
| EP | 2390577 A1 | 11/2011 |

*Primary Examiner* — Suezu Ellis

(57) ABSTRACT

A user interface assembly for a household appliance is designed and adapted to provide good lighting execution maintaining a directly coupled touch field unit. The user interface includes a decorative overlay, a structural light box, and a printed circuit board with an integrated touch field unit and plurality of top-fire LED. The printed circuit board is mounted to a mounting frame extending from the inner surface of the structural light box without the use of adhesive. The structural light box is box includes a conical light aperture and dimensioned to maximize thickness to improve lighting diffusion, but keeping the overall thickness of the structural light box within the maximum range acceptable for optimal functionality and sensitivity of the touch field unit through direct coupling.

20 Claims, 3 Drawing Sheets

(56) References Cited

U.S. PATENT DOCUMENTS

| | | | |
|---|---|---|---|
| 2006/0016096 A1 | 1/2006 | Kim | |
| 2014/0300263 A1* | 10/2014 | Sung | G06F 3/044 |
| | | | 312/404 |
| 2014/0301106 A1* | 10/2014 | Schuh | H05K 3/30 |
| | | | 362/612 |
| 2016/0295644 A1* | 10/2016 | Khokle | H05B 6/04 |
| 2017/0089633 A1* | 3/2017 | Kim | A47L 15/4293 |
| 2017/0153055 A1* | 6/2017 | Hong | F25D 23/028 |
| 2017/0183808 A1* | 6/2017 | De Pellegrin | D06F 39/12 |
| 2017/0234609 A1* | 8/2017 | Park | F25D 29/005 |
| | | | 345/174 |
| 2018/0003428 A1* | 1/2018 | Kwon | F25D 23/028 |

\* cited by examiner

USER INTERFACE FOR A HOUSEHOLD APPLIANCE

BACKGROUND

A user interface for a household appliance includes a decorative overlay, a structural light box, and a printed circuit board with an integrated touch field unit and a plurality of top-fire LED. The integrated touch field unit is directly coupled to the light box without the use of adhesive. The user interface assembly usually requires a thicker light box with the use of a top-fire LED for a diffused and uniform lighting. However, a thicker light box will reduce the functionality and sensitivity of a directly coupled touch field unit. Thus, it would be desirable to have a user interface assembly with good lighting execution that maintains an optimal functionality and sensitivity of the touch field unit through direct coupling.

BRIEF SUMMARY

One aspect of the invention relates to a user interface for a household appliance with a directly coupled touch field unit. The user interface comprises a structural light box with a decorative overlay adhered or molded to the outside surface of the light box. The light box also includes a mounting frame extending from the inside surface of the light box. A printed circuit board with an integrated touch field unit is mounted to the mounting frame via snap connectors. The said snap connectors include protrusions that exert a pressing force upon the printed circuit board in a direction towards the structural light box to maintain an optimal functionality and sensitivity of the touch field unit.

Another aspect of the invention relates to a user interface for a household appliance with a structural light box that provides good lighting execution whilst maintaining a functional directly coupled touch field unit. The structural light box includes a conical light aperture and dimensioned to maximize thickness to improve lighting diffusion, but keeping the overall thickness of the structural light box within the maximum range acceptable for optimal functionality and sensitivity of the touch field unit through direct coupling.

DETAILED DESCRIPTION

Figure 1:
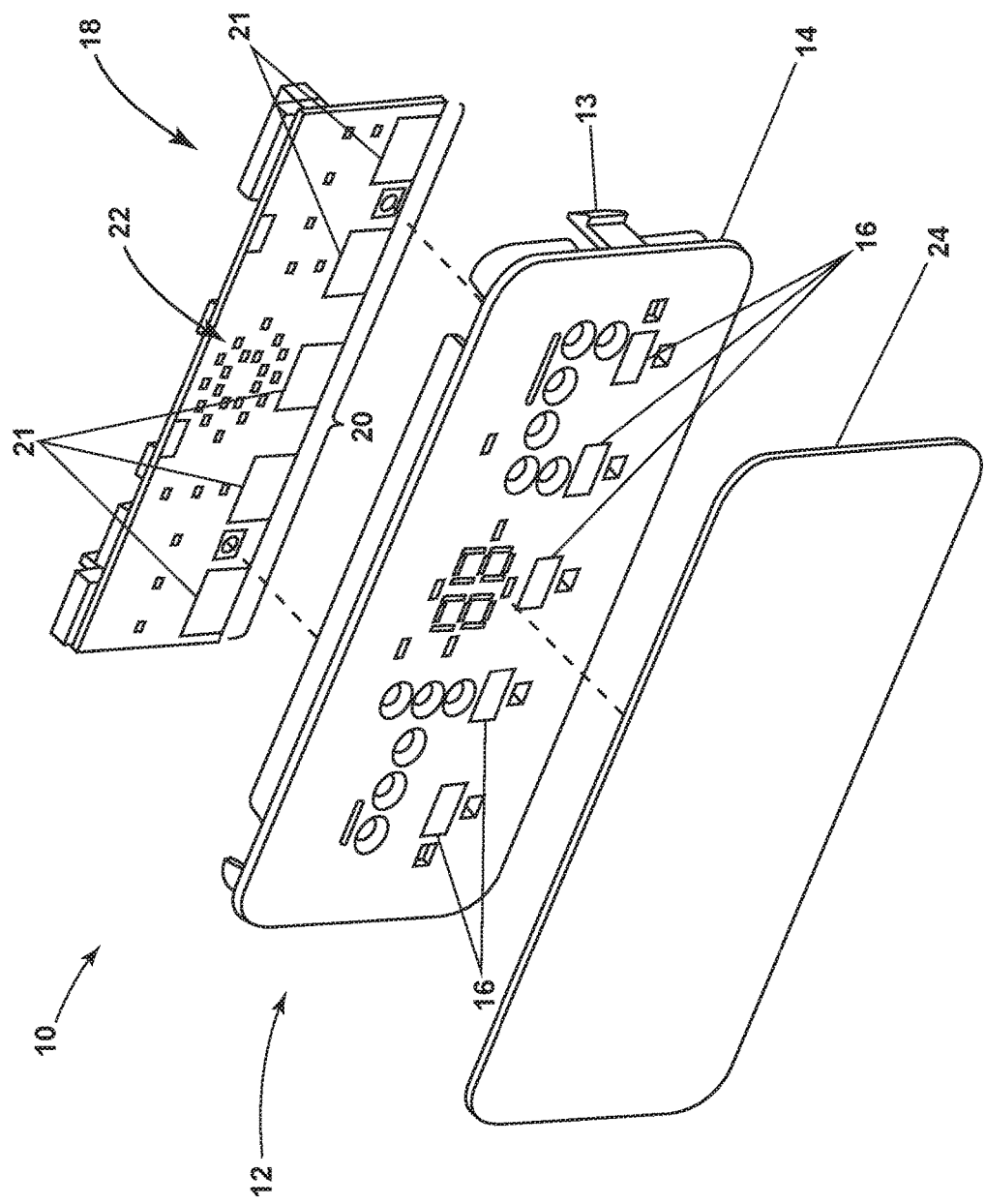
FIG. 1 is an exploded, perspective view of a user interface assembly.

FIG. 1 shows a perspective exploded view of a user interface 10 of the type incorporating aspects of the invention in the environment of a laundry treating appliance. Although reference is made herein to a laundry treating appliance, this shall not be construed as limiting the scope of the invention. Rather, the invention can be applied and used in connection with any other type of household appliance, for example stoves, dishwashers, microwave ovens, refrigerators and the like.

Note that the term back view or back side shall mean that in the ordinary mounting position, the respective side is oriented towards the appliance and is therefore not visible from the outside. The term front view and front side shall mean that the respective side is oriented away from the appliance, and if applicable visible from the outside. The terms right hand side and left hand side, upper and lower used insofar correspond to respective representation shown in the Figures.

Figure 2:
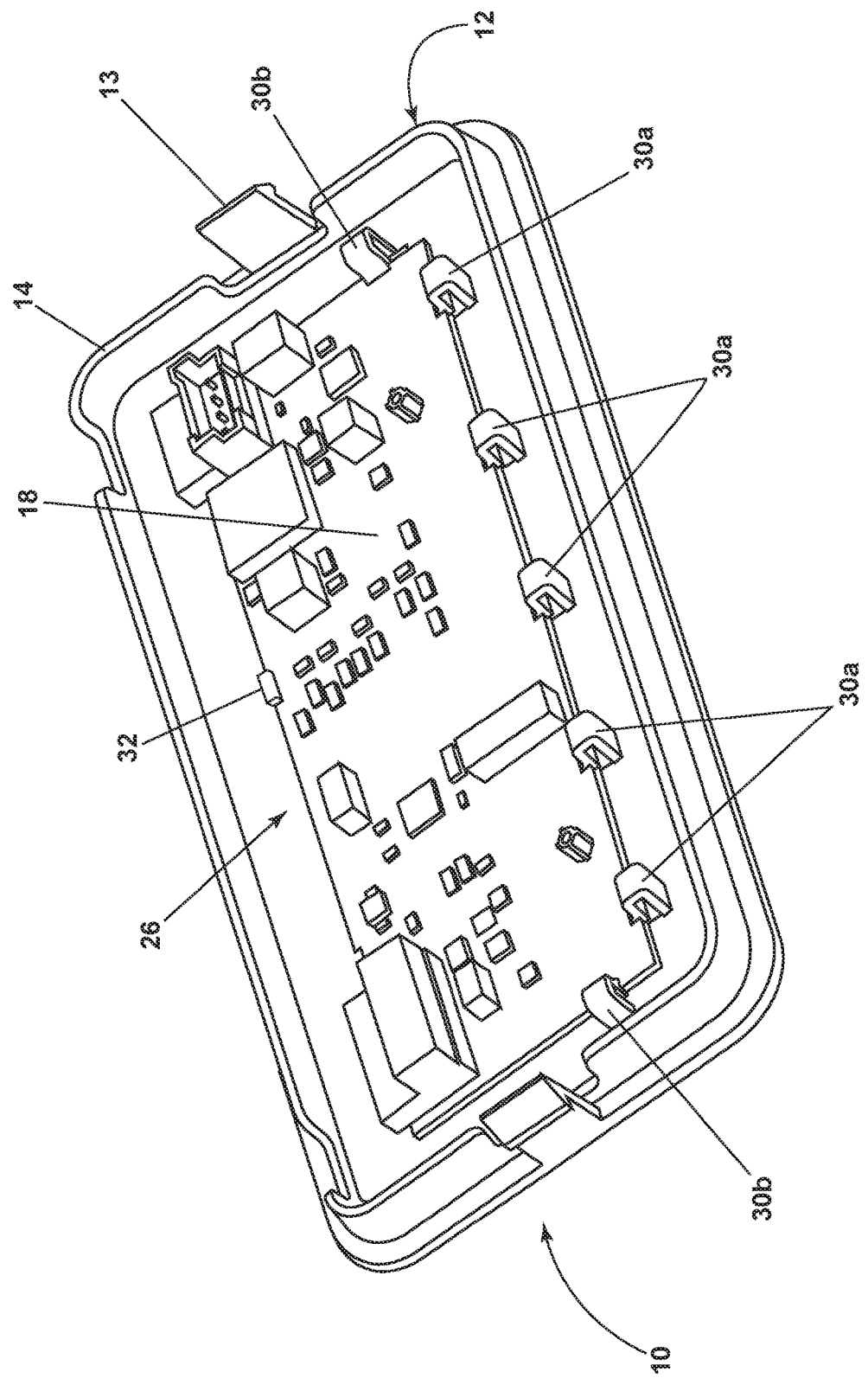
FIG. 2 is a back view of a user interface assembly of FIG. 1.

As shown in FIGS. 1 and 2, the user interface 10 comprises a fixture 12 that can be attached to the laundry treating appliance (not shown) via a snap-on mechanism 13. The fixture is comprised of a structural light box H having a planar surface with an integrated mounting frame 26 at the back side of the fixture 12 and a touch pad interface 16 exposed on the outside surface. A printed circuit board 18 comprises an integrated touch field unit 20 and a plurality of top-fire LED 22. As shown in the illustration, the integrated touch field unit 20 comprises several touch sensors 21 that align to the corresponding touch pad interface 16 located on the outside surface of the structural light box 14 when directly coupled. The mounting frame 26 may include a section to which an actuator (not shown), which may be a push and/or rotating type button, is detachably mounted to. A decorative overlay 24 is adhesively bonded to the front surface of the structural light box 14 the front side of which constitutes an interface presented to a user of the laundry treating appliance. In an alternative embodiment, the decorative overlay 24 and structural light box 14 can be a single integrated assembly.

FIG. 2 shows a back view of the fixture 12 with the printed circuit board 18 detachably mounted to the mounting frame 26. The mounting frame 26 comprises plurality of snap connectors 30a, which are designed and adapted for detachably mounting the printed circuit board 18 and maintaining a direct coupling pressure between the integrated touch field unit 20 and the structural light box 14 without the use of adhesives.

In addition, locking pins 32 that act as lateral stops are provided at the upper part of the mounting frame 26. Additional snap connectors 30b located to the left and right side of the mounting frame 26 may also act as a guiding element when mounting the printed circuit board 18 to the mounting frame 26.

As seen in FIG. 2, to assemble the user interface 10, the printed circuit board 18 is first pushed into the mounting frame 26 from the lower side to the upper side in a slightly tilted manner. The printed circuit board 18 is pushed into the mounting frame 26 whilst left and tight edges of the printed circuit board 18 are guided by the snap connectors 30b located to the left and right side of the mounting frame. The printed circuit board 18 is pushed upwards until its top side abuts the locking pins 32. At this stage, the printed circuit board 18, in particular the lower part, is pressed downwards such that snap connectors 30b,a positioned at the left, right, and lower portion of the mounting frame 26 engage the printed circuit board 18 in respective left, right and lower edge sections. Following these steps, the printed circuit board 18 will be detachably mounted to the mounting frame 26 with proper and fixed alignment.

Figure 3:
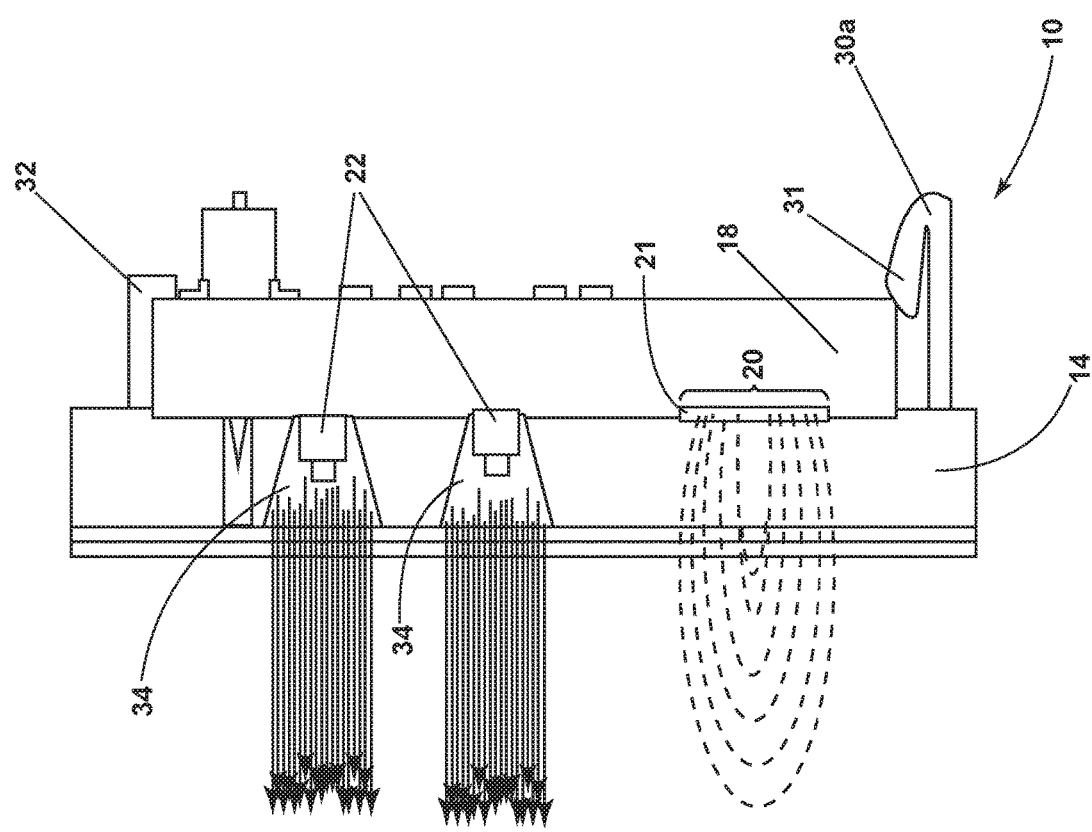
FIG. 3 is a cross section of the user interface assembly of FIG. 2.

FIG. 3 shows the cross sectional view of the user interface 10 with the printed circuit board 18 mounted thereto. As shown in the Figure, the upper portion of the printed circuit board 18 is secured in place by the locking pins 32 and lower portion of the printed circuit board 18 is secured by the snap connectors 30a. Further, the plurality of snap connectors 30a are positioned at the lower portion of the mounting frame where most of the touch sensors 21 on the printed circuit board 18 are located. As illustrated, each of the snap connectors 30a includes a hook like protrusion 31. This configuration utilizes these protrusions 31, in particular spring like protrusions, protruding from the snap connectors 30a where it forms a contact with the back side of the printed circuit board 18 when mounted, are designed and adapted to exert a pressing force upon the touch field unit 20 of the printed circuit board 18 in a direction towards the structural light box 14. The pressing force is such that the touch sensors 21 on the printed circuit board is urged against the structural light box 14 in such a manner that optimal functionality and sensitivity of the touch sensors 21 can be achieved.

In addition, the structural light box 14 is designed and adapted to maintain a good lighting execution of the top-fire LED 22 while maintaining the optimal functionality and sensitivity of the touch sensors 21. This is achieved by limiting the dimension of the structural light box 14 to a predetermined thickness of 3-4 mm and having a light passage 34 with conical aperture in registry with the top-fire LED 22. The said structure will be able to utilize the maximum thickness to improve lighting diffusion, but keeping the overall thickness of the structural light box 14 within the maximum range acceptable for optimal functionality and sensitivity of the touch sensors 21 through direct coupling.

While the snap-on feature may be a common mechanism to mount a printed circuit board to a mounting frame of a user interface, the combination of the snap-on mechanism with the structural light box to maintain the direct coupling function and good lighting execution is unique to the present invention. Further, because of the unique manner in which the structural light box 14 is designed, the use of top-fire LED 22 in combination with the direct coupling between the touch sensors 21 and touch pad interface 16 is possible. A second advantage of the present invention is the ease of assembly of the user interface 10 as it can be completed without the need of adhesives or an external touch field unit independent from the printed circuit board.

While the user interface of the present invention has been described in detail hereinabove, it is apparent that various changes and modifications might be made without departing from the scope of the present invention, which is set forth in the following claims.

The invention claimed is:

1. A user interface comprising:
   a light box having a planar surface with at least one light aperture extending therethrough and having an outside surface and an inside surface;
   at least one touch pad interface exposed on the outside surface of the light box;
   a mounting frame integral with and extending from the inside surface of the light box and having integral multiple snap-on mechanisms; and
   a printed circuit board (PCB) having at least one touch sensor and at least one top fire light emitting diode (LED) emitting light generally perpendicular to a surface of the PCB;
   wherein the PCB is compressively retained against the inside surface of the light box by the snap-on mechanisms with the at least one touch sensor in registry with the at least one touch pad interface and the at least one top fire LED in registry with the at least one light aperture to provide direct coupling between the at least one touch pad interface and the at least one touch sensor.

2. The user interface of claim 1 further comprising an overlay on the outside surface of the light box.

3. The user interface of claim 2 further comprising indicia on the overlay wherein the indicia is associated with the at least one touch pad interface and the at least one top fire LED.

4. The user interface of claim 2 wherein the overlay is one of adhered to or molded with the light box.

5. The user interface of claim 1 wherein the at least one light aperture is cone shaped.

6. The user interface of claim 1 wherein the snap-on mechanisms comprise snap connectors.

7. The user interface of claim 6 wherein the snap-connectors comprise protrusions that bias the PCB toward the inside surface.

8. The user interface of claim 1 wherein the planar surface is dimensioned to enable direct coupling between the at least one touch pad interface and the at least one touch sensor.

9. The user interface of claim 1 wherein the light box planar surface has a predetermined thickness of 3-4 mm to enable performance thresholds of the touch sensor.

10. The user interface of claim 1 wherein the LED faces the light box.

11. An appliance comprising:
    a user interface having a light box having a planar surface with at least one light aperture extending therethrough and having an outside surface and an inside surface;
    at least one touch pad interface exposed on the outside surface of the light box;
    a mounting frame integral with and extending from the inside surface of the light box and having integral multiple snap-on mechanisms; and
    a printed circuit board (PCB) having at least one touch sensor and at least one top fire light emitting diode (LED) emitting light generally perpendicular to a surface of the PCB;
    wherein the PCB is compressively retained against the inside surface of the light box by the snap-on mechanisms with the at least one touch sensor in registry with the at least one touch pad interface and the at least one top fire LED in registry with the at least one light aperture to provide direct coupling between the at least one touch pad interface and the at least one touch sensor.

12. The appliance of claim 11 further comprising an overlay on the outside surface of the light box.

13. The appliance of claim 12 further comprising indicia on the overlay wherein the indicia is associated with the at least one touch pad interface and the at least one top fire LED.

14. The appliance of claim 12 wherein the overlay is one of adhered to or molded with the light box.

15. The appliance of claim 11 wherein the at least one light aperture is cone shaped.

16. The appliance of claim 11 wherein the snap-on mechanisms comprise snap connectors that bias the PCB toward the inside surface.

17. The appliance of claim 16 wherein the snap-connectors comprise protrusions that bias the PCB toward the inside surface.

18. The appliance of claim 11 wherein the planar surface is dimensioned to enable direct coupling between the at least one touch pad interface and the at least one touch sensor.

19. The appliance of claim 18 wherein the light box planar surface has a predetermined thickness of 3-4 mm to enable performance thresholds of the touch sensor.

20. The appliance of claim 11 wherein the LED faces the light box.

\* \* \* \* \*